(12) United States Patent
Liu et al.

(10) Patent No.: US 8,569,897 B2
(45) Date of Patent: Oct. 29, 2013

(54) PROTECTION LAYER FOR PREVENTING UBM LAYER FROM CHEMICAL ATTACK AND OXIDATION

(75) Inventors: Chung-Shi Liu, Shin-chu (TW); Chien Ling Hwang, Hsinchu (TW); Ming-Che Ho, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 173 days.

(21) Appl. No.: 12/786,818

(22) Filed: May 25, 2010

(65) Prior Publication Data

US 2011/0062580 A1     Mar. 17, 2011

Related U.S. Application Data

(60) Provisional application No. 61/242,179, filed on Sep. 14, 2009.

(51) Int. Cl.
   *H01L 23/48*     (2006.01)
   *H01L 23/52*     (2006.01)
   *H01L 29/40*     (2006.01)

(52) U.S. Cl.
   USPC .......................................... 257/781; 438/614

(58) Field of Classification Search
   USPC ................... 438/614; 257/779–781
See application file for complete search history.

(56) References Cited

U.S. PATENT DOCUMENTS

| | | | |
|---|---|---|---|
| 6,218,281 B1 | 4/2001 | Watannabe et al. | |
| 6,229,220 B1 | 5/2001 | Saitoh et al. | |
| 6,578,754 B1 | 6/2003 | Tung | |
| 6,592,019 B2 | 7/2003 | Tung | |
| 6,818,545 B2 | 11/2004 | Lee et al. | |
| 6,853,076 B2 | 2/2005 | Datta et al. | |
| 6,917,119 B2 | 7/2005 | Lee et al. | |
| 7,064,436 B2 | 6/2006 | Ishiguri et al. | |
| 7,391,112 B2 | 6/2008 | Li et al. | |
| 7,786,581 B2 * | 8/2010 | Kang et al. | 257/737 |
| 2003/0222352 A1* | 12/2003 | Kung et al. | 257/772 |

FOREIGN PATENT DOCUMENTS

| | | |
|---|---|---|
| CN | 101325167 | 12/2008 |
| JP | 1993335313 | 12/1993 |
| JP | 2000228420 | 8/2000 |

OTHER PUBLICATIONS

Office Action dated Mar. 28, 2012 from corresponding application No. CN 201010284468.X.

* cited by examiner

*Primary Examiner* — Jenny L Wagner
(74) *Attorney, Agent, or Firm* — Lowe Hauptman & Ham, LLP (57) ABSTRACT

A protection layer formed of a $CuGe_yN_z$ layer, a $CuSi_xN_z$ layer, a $CuSi_xGe_yN_z$ layer or combinations thereof is formed on an under-bump metallurgy (UBM) layer for preventing the UBM layer from chemical attack and oxidation during subsequent processes.

20 Claims, 13 Drawing Sheets

PROTECTION LAYER FOR PREVENTING UBM LAYER FROM CHEMICAL ATTACK AND OXIDATION

CROSS-REFERENCE TO RELATED APPLICATIONS

The present application claims priority of U.S. Provisional Patent Application Ser. No. 61/242,179 filed on Sep. 14, 2009 which is incorporated herein by reference in its entirety.

TECHNICAL FIELD

This disclosure relates to the fabrication of integrated circuit devices, and more particularly, to the fabrication of bump structures in integrated circuit devices.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder bumps.

In a typical bump formation process, an under bump metallurgy (UBM) is formed, followed by the formation of a bump on the UBM. The UBM formation may include forming a copper seed layer, and forming and patterning a mask on the copper seed layer so that a portion of the copper seed layer is exposed through an opening in the mask. A plating step is then performed to plate a thick copper layer on the exposed portion of the copper seed layer. In the forming and patterning of the mask, residues (known as a scum) of the mask may be undesirably left or be generated as a by-product of the patterning step. A descum step is then performed to remove the scum before the copper plating. Traditional process utilizes a strong $CF_4/O_2/N_2$ descum process to remove the scum and oxidation, but the descum process causes residual fluorine ions on the wafer, which enhance the speed of UBM oxidation in ambient environment and also diffuse out and contaminate other surrounding wafers.

Moreover, it is observed that the queue time (Q-time) after the descum step is very short, sometime shorter than 12 hours, wherein the Q-time is the time that the respective wafer can be stored without incurring significant degradation before the copper plating. However, four process steps may be needed before the copper plating, and these process steps may take a long period of time. Serious UBM oxidation was found after descum process even though it was still within Q-time. If the Q-time expires while the copper plating has not been performed, the respective wafer has to be re-descumed to re-clean the surface of the wafer. However, the re-descum would damage the profile and the dimension of the mask, and damage the shape and the dimension of the resulting via on the metal surface as well, and hence cause the difficulties in controlling the bump height and bump strength. These challenges contribute significantly to high manufacturing cost and poor bump reliability.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION OF ILLUSTRATIVE EMBODIMENTS

In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, cross-sectional diagrams of FIG. 1A to FIG. 1H illustrate an exemplary embodiment of a bump formation process.

Figure 1A:
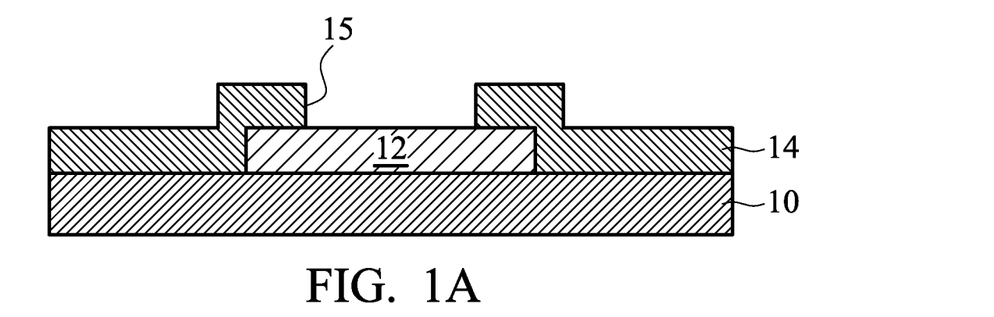
FIG. 1A to FIG. 1H are cross-sectional diagrams depicting an exemplary embodiment of a Cu post formation process.

In FIG. 1A, an example of a substrate 10 may include a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

A conductive region 12 is a top metallization layer formed in a top-level inter-layer dielectric layer, which is a portion of conductive routes and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials, although it may also be formed of, or include, other materials such as copper, silver, gold, nickel, tungsten, alloys thereof, and/or multi-layers thereof. In one embodiment, the conductive region 12 is a bond pad region 12, which may be used in the bonding process to connect the integrated circuits in the respective chip to external features.

FIG. 1A also depicts a passivation layer 14 formed on the substrate 10. The passivation layer 14 is patterned to form an opening 15 exposing a portion of the conductive region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

Figure 1B:
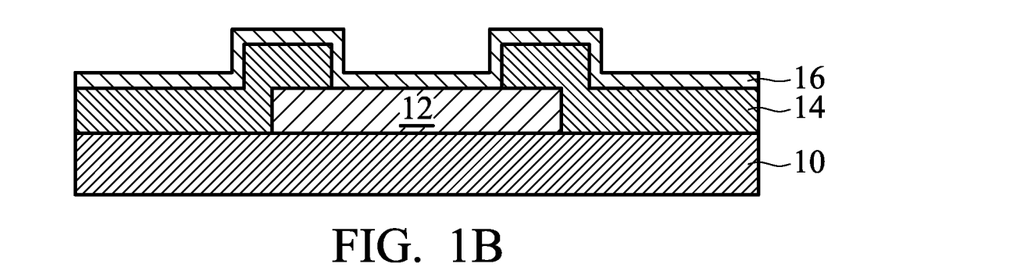

In FIG. 1B, the formation of an under-bump-metallurgy (UBM) layer 16 is performed on the resulted structure, electrically connected to the conductive region 12. The UBM layer 16 is formed on the passivation layer 14 and the exposed portion of the conductive region 12, and lines the sidewalls and bottom of the opening 15. In an embodiment, the UBM layer 16 includes a diffusion barrier layer and/or a seed layer. The diffusion barrier layer, also referred to as a glue layer, is formed to cover the sidewalls and the bottom of the opening 15. The diffusion barrier layer may be formed of titanium, although it may also be formed of other materials such as titanium nitride, tantalum, tantalum nitride, or the like. The formation methods include physical vapor deposition (PVD) or sputtering. The seed layer may be a copper seed layer formed on the diffusion barrier layer using PVD or sputtering. The seed layer may be formed of copper alloys that include silver, chromium, nickel, tin, gold, or combinations thereof. In one embodiment, the UBM layer 16 is a Cu/Ti layer. The diffusion barrier layer may have a thickness about 1 k~2 k Angstroms, and the seed layer may have a thickness equal to about 3~7 k Angstroms, although their thicknesses may also be greater or smaller. One skilled in the art will realize that the dimensions recited throughout the description are merely examples, and will be scaled with the downscaling of integrated circuits.

Figure 1C:
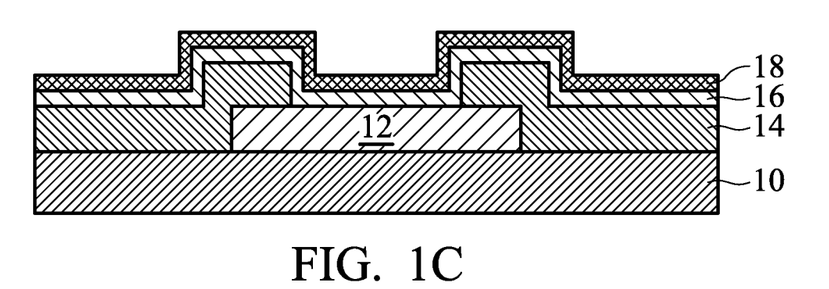

Next, in FIG. 1C, a first protection layer 18 is formed on the UBM layer 16. The first protection layer 18 is employed for preventing the UBM layer 16 from chemical attack and/or oxidation during subsequent processes, such as photolithography, baking, and descum processes. Thus the first protection layer 18 may also refer to an antioxidation layer or an oxide resistant layer. The first protection layer 18 is a copper-containing layer comprising Ge, Si, N, or combinations thereof. In an embodiment, the first protection layer 18 includes a $CuGe_yN_z$ layer, a $CuSi_xN_z$ layer, a $CuSi_xGe_yN_z$ layer, or combinations thereof. For example, the formation of the first protection layer 18 may include the step of selectively forming (or growing, or depositing) at least one layer comprising Cu, N, and also Si and/or Ge on a copper layer by exposing the structure to a $GeH_4$ and/or $SiH_4$ comprising ambient with an additional $NH_3$ source gas and then performing a $NH_3$ plasma treatment.

Figure 1D:
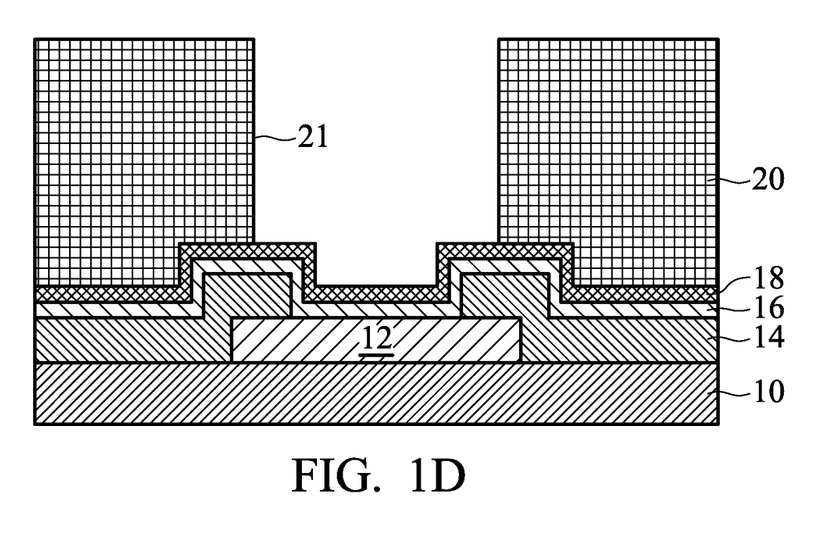

FIG. 1D illustrates the formation a mask layer 20 provided on the first protection layer 18 and patterned with an opening 21 for example, by exposure, development or etching, so that a portion of the first protection layer 18 is exposed for bump formation. In one embodiment, the opening 21 in the mask layer 20 is positioned over the opening 15 in the passivation layer 14. The diameter of the opening 21 is greater or equal to the diameter of the opening 15. The mask layer 20 may be a dry film or a photoresist film. In an embodiment, the mask layer 20 is a dry film, and may be formed of an organic material such as Ajinimoto buildup film (ABF). In alternative embodiments, the mask layer 20 is formed of a photo resist. The thickness of the mask layer 20 may be greater than about 5 μm, or even between about 10 μm and about 120 μm.

A baking process is then performed to harden the mask layer 20. The baking process may be performed in an oven at a temperature equal to about 130° C., for example, and for about one hour. Residues (not shown), which may be the remaining portion of the mask layer 20 and/or the by-product generated in the mask patterning steps, may be left over the first protection layer 18. In an embodiment, after the baking process, a descum step is performed to remove the residues from the first protection layer 18. The process gases of the descum step may include tetrafluoride ($CF_4$), nitrogen ($N_2$), and oxygen ($O_2$) (referred to as $CF_4/N_2/O_2$ hereinafter).

Figure 1E:
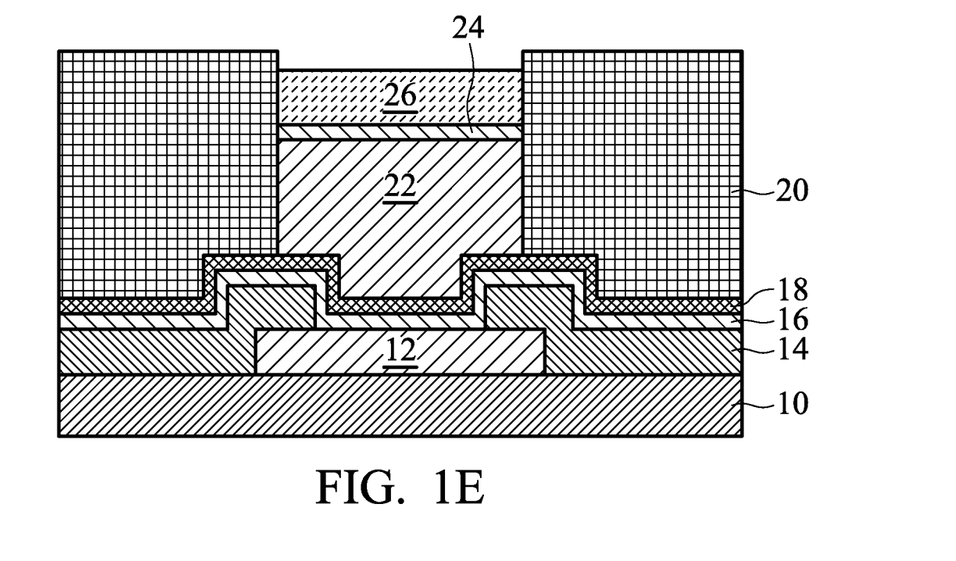

Referring to FIG. 1E, the opening 21 is partially filled with a conductive material with solder wettability. In an embodiment, a copper (Cu) layer 22 is formed on the exposed portion of the first protection layer 18 to partially fill the opening 21. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the thick Cu layer 22. In an exemplary embodiment, the thickness of the thick Cu layer 22 is greater than 40 um. In other embodiments, the thickness of the thick Cu layer 22 is about 40~70 μm, although the thickness may be greater or smaller.

Then, a cap layer 24 is deposited on the thick Cu layer 22 within the opening 21. The cap layer 24 could act as a barrier layer to prevent copper in the thick Cu layer 22 from diffusing into bonding material, such as solder bump, that is used to bond the substrate 10 to external features. The prevention of copper diffusion increases the reliability and bonding strength of the package. The cap layer 24 may include nickel, tin, tin-lead (SnPb), gold (Au), silver, palladium (Pd), indium (In), nickel-palladium-gold (NiPdAu), nickel-gold (NiAu) or other similar materials or alloy. In an embodiment, the cap layer 40 is a nickel layer, an Au layer, or a NiAu layer by plating. In an exemplary embodiment, the thickness of the cap layer 24 is about 1~5 μm, although the thickness may be greater or smaller. A solder layer 26 is then formed on the cap layer 24 within the opening 21. The solder layer 26 can be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. The solder volume does not change during thermal annealing.

Figure 1F:
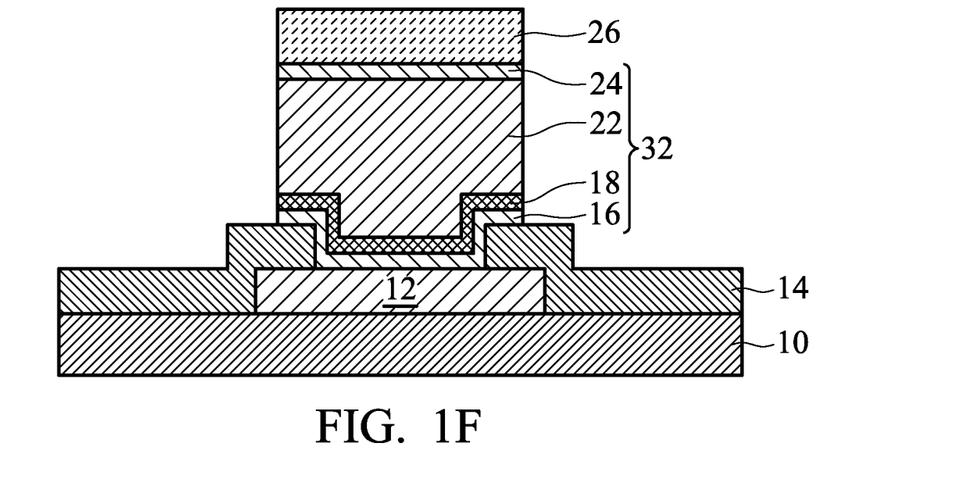

In FIG. 1F, the mask layer 20 is removed. As a result, the portion of the first protection layer 18 underlying the mask layer 20 is exposed, leaving the stack of layers 22, 24 and 26 protruding from the first protection layer 18. In the case the mask layer 20 is a dry film, it may be removed using an alkaline solution. If the mask layer 20 is formed of photoresist, it may be removed by a wet stripping process using acetone, n-methyl pyrrolidone (NMP), dimethyl sulfoxide (DMSO), aminoethoxy ethanol, and the like. Then the exposed portion of the first protection layer 18 is removed followed by the removal of the UBM layer 16 so that the underlying passivation layer 14 outside the thick Cu layer 22 is exposed. Thus the thick Cu layer 22 becomes a Cu protrusion. In an exemplary embodiment, the step of removing the UBM layer 16 is a dry etching or a wet etching depending on the metallurgy of the UBM metallurgy as will be appreciated by those skilled in the art. For example, an isotropic wet etching (often referred to as flash etching due to its short duration) using an ammonia-based acid is employed. Hereinafter, the Cu protrusion is also referred to as a Cu post 22, while the metallization layers 24, 22, 18 and 16 are referred to as a metallization structure 32 that protrudes from the passivation layer 14 and has exposed sidewalls.

Figure 1G:
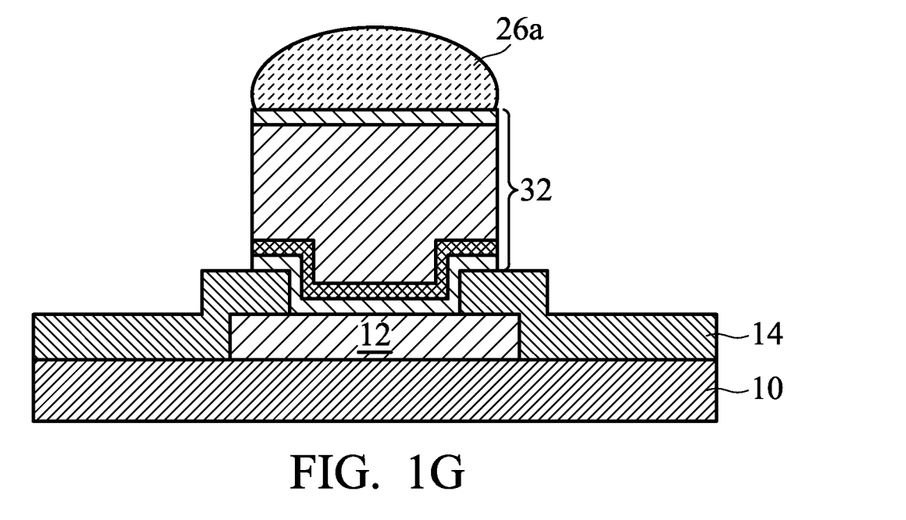
Figure 1H:
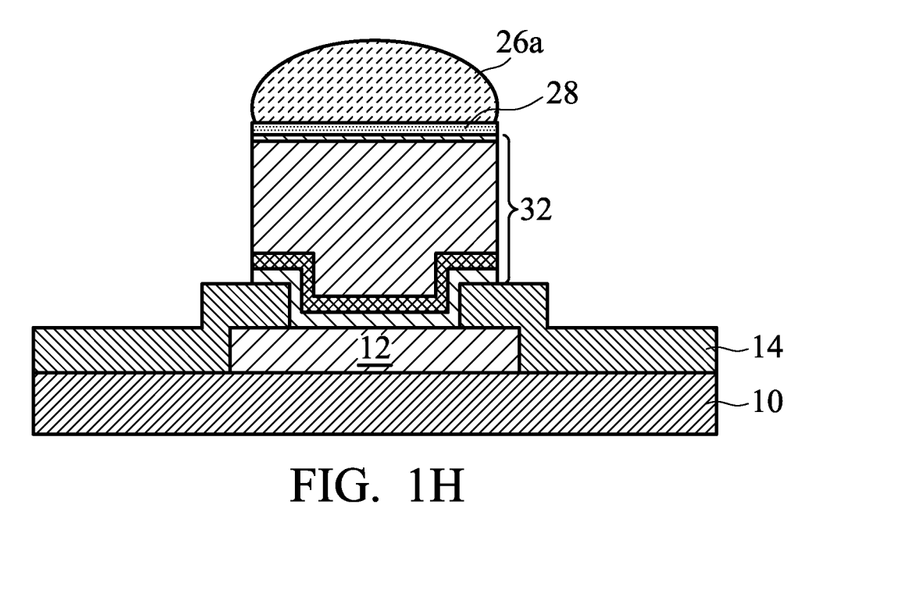

FIG. 1G depicts the formation of a solder bump 26a on the cap layer 24 by performing a reflow process on the solder layer 26. During thermal cycling, the tin in the solder layer 26 tends to migrate through cracks or other defects and react with the underlying layer (such as the cap layer 24 and/or the Cu post 22) to form an intermetallic compound (IMC) layer 28 which may be observed between the solder bump 26a and the metallization structure 32. In an embodiment, the IMC layer 28 is formed among the solder bump 26a, the cap layer 24 and the Cu post 22 as shown in FIG. 1H. If the cap layer 24 includes Ni, a $(Cu,Ni)_xSn_y$ IMC layer may be formed at the interface, which may have a controllable thickness and good adhesion. The cap layer 24 may be consumed during the IMC formation. The substrate 10 is then sawed and packaged onto a package substrate, or another die, with solder bumps or Cu posts mounted on a pad on the package substrate or the other die.

The first protection layer 18 is formed between the UBM layer 16 and the Cu post 22 to prevent UBM interface damage, improve bump reliability, and enlarge process windows. This can provide the UBM layer with better interface adhesion and minimize the voids generated in the UBM layer, thus the bump strength is increased, the bump height variation is decreased and the bump co-planarity is improved since the damages to the mask layer and the via bottom metal surface are prevented. Also, the resistance of electrical connection between the solder bump and the bond pad is reduced because the first protection layer 18 prevents metal oxidation. Moreover, the Q-time limitation can be extended from less than 12 hours to more than 24 hours. The protection layer 18 added in the bump structure significantly contributes to extended device reliability and longevity such as thermal cycle (TC), power cycle (PC), or electron migration (EM) performance and reduces manufacturing costs. In addition, this will form a uniform and flat IMC layer among the UBM layer, the protection layer and the SAC (SnAgCu) joint.

Figure 2A:
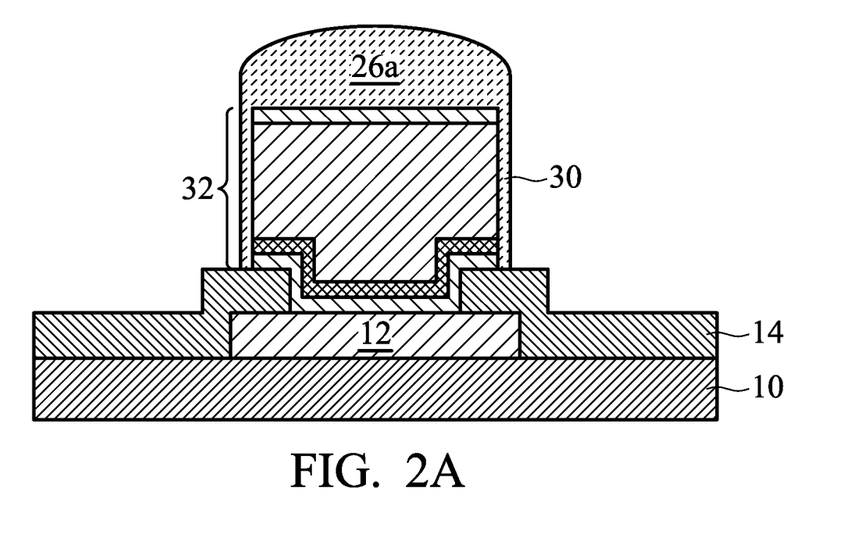
FIG. 2A to FIG. 2B are cross-sectional diagrams depicting an exemplary embodiment of a Cu post formation process.
Figure 2B:
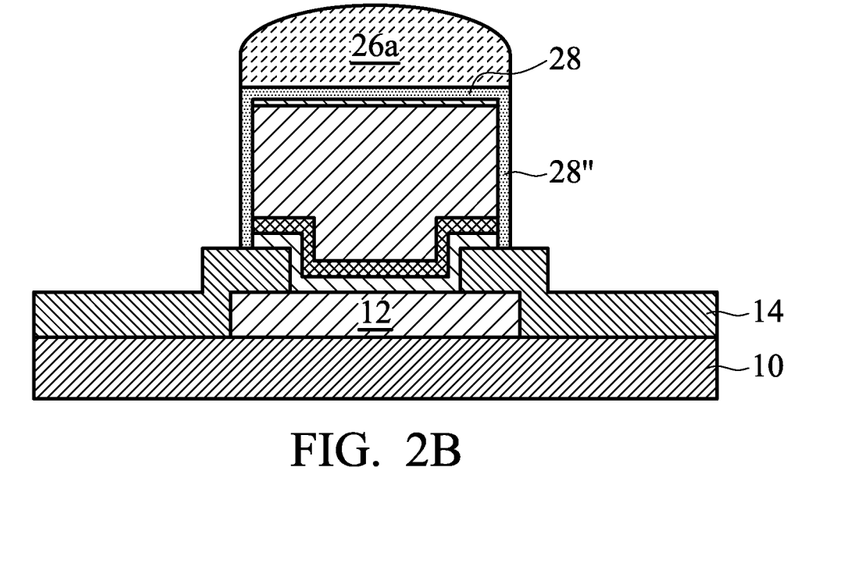

FIG. 2A and FIG. 2B are cross-sectional diagrams depicting an exemplary embodiment of a Cu post structure with a second protection layer 30, while explanation of the same or similar portions to the description in FIG. 1A to FIG. 1H will be omitted. Referring to FIG. 2A, after forming the solder bump 26a, a second protection layer 30 is formed on sidewalls of the metallization structure 32. The second protection layer 30 may also be formed on the surface of the solder bump 26a. The second protection layer 30 may be selectively formed on the sidewall surface of the metallization structure 32 without forming on the passivation layer 14. In an embodiment, the second protection layer 30 is a tin-containing layer. For example, the bump structure is immersed in an electroless plating solution containing tin (Sn). Tin is deposited on the protrusion by a chemical reduction process, which once initiated, is autocatalytic. Sn ions in the electroless solution are reduced by chemical agents in the solution, and deposit on the surfaces of the protrusion. Since the plating reaction only occurs on the surface of the protrusion of metal material layers, no tin will be plated on the surface of the passivation layer 14. The second protection layer 30 provides an environmental seal to prevent the metallization structure 32 from oxidation and also improve the adhesion between the metallization structure 32 and the underfill in the following package process. As depicted in FIG. 2B, during thermal cycling, the tin in the solder layer 26 tends to migrate to form an intermetallic compound (IMC) layer 28 which may be observed between the solder bump 26a and the metallization structure 32. In an embodiment, the IMC layer 28 is formed among the solder bump 26a, the cap layer 24 and the Cu post 22. The IMC layer 28 is a $(Cu,Ni)_xSn_y$ IMC layer, which may consume some or the entire of the cap layer 24. Also, the tin in the second protection layer 30 tends to migrate to form another intermetallic compound (IMC) layer 28" which may be observed on the sidewalls of the metallization structure 32. The IMC layer 28" is a Cu—Sn IMC layer, which may consume some or the entire of the second protection layer 30.

Figure 3A:
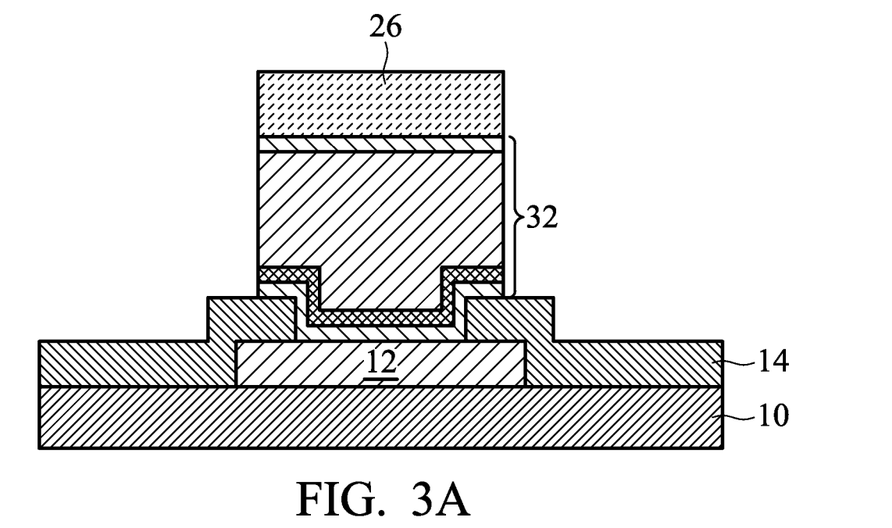
FIG. 3A to FIG. 3C are cross-sectional diagrams depicting an exemplary embodiment of a Cu post formation process.
Figure 3B:
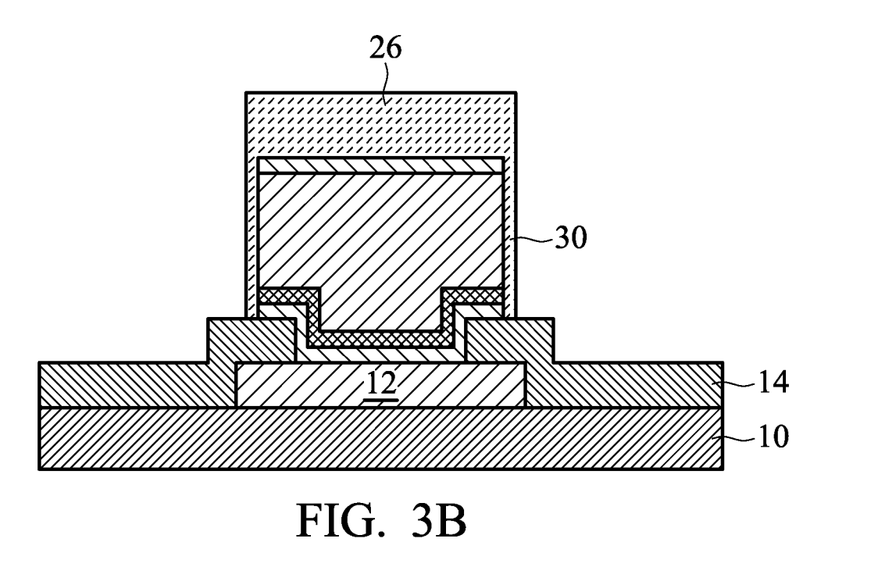
Figure 3C:
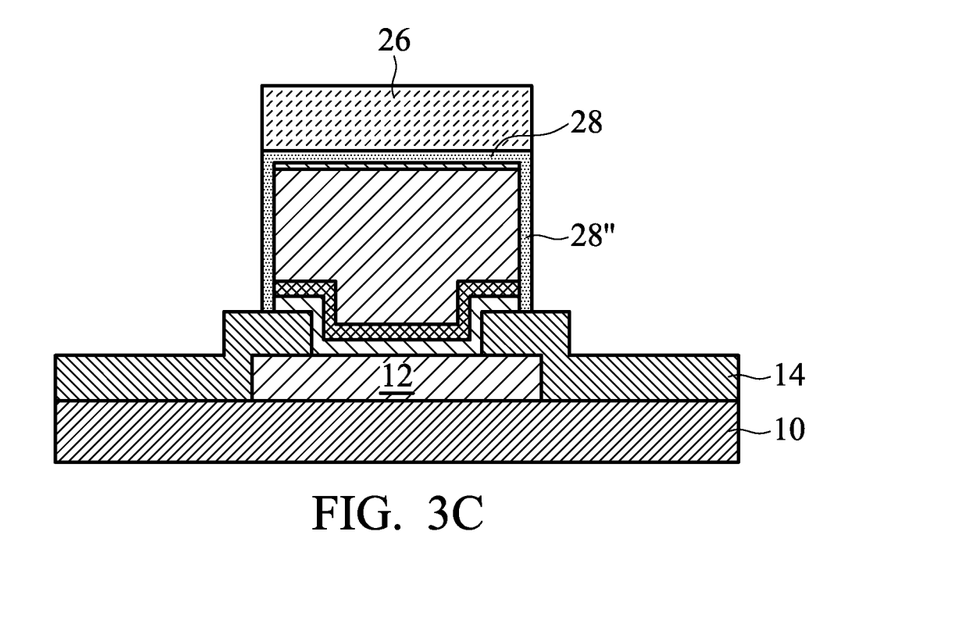

FIG. 3A to FIG. 3C are cross-sectional diagrams depicting an exemplary embodiment of a bump process with a non-reflowing solder layer and a sidewall protection layer, while explanation of the same or similar portions to the description in FIG. 1A to FIG. 1H and FIG. 2A to FIG. 2B will be omitted. Referring to FIG. 3A and FIG. 3B, after removing the mask layer 20 and etching the first protection layer 18 and the UBM layer 16, the second protection layer 30 is formed on the sidewalls of the metallization structure 32 without performing the solder reflowing process on the solder layer 26. The second protection layer 30 may also formed on the surface of the solder layer 26. In an embodiment, the second protection layer 30 is a tin-containing layer formed through a tin immersion process. As depicted in FIG. 3C, during thermal cycling, the IMC layer 28 may be observed between the solder layer 26 and the metallization structure 32. In one embodiment, the IMC layer 28 is a $(Cu,Ni)_xSn_y$ IMC layer, which may consume some of the cap layer 24. Also, the IMC layer 28" may be observed on the sidewalls of the metallization structure 32. In one embodiment, the IMC layer 28" is a Cu—Sn IMC layer, which may consume some or the entire of the second protection layer 30.

Figure 4A:
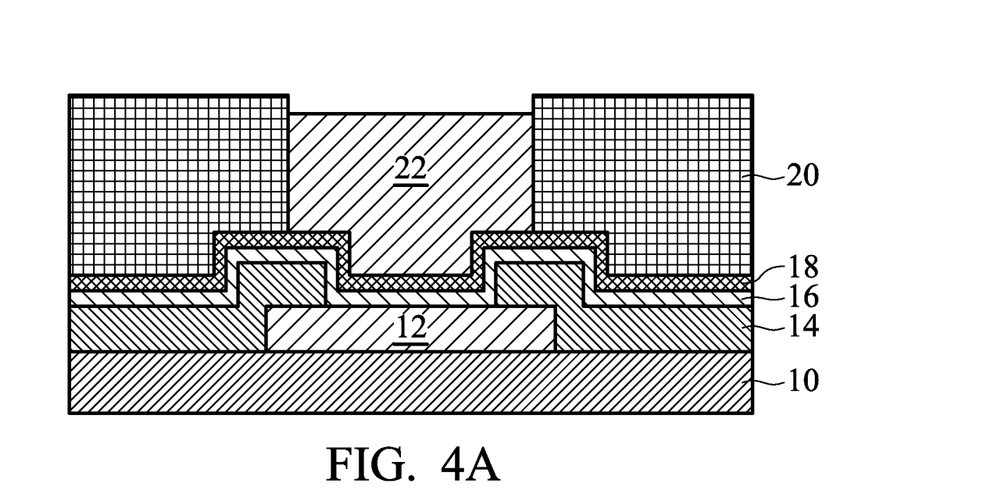
FIG. 4A to FIG. 4D are cross-sectional diagrams depicting an exemplary embodiment of a Cu post formation process.
Figure 4B:
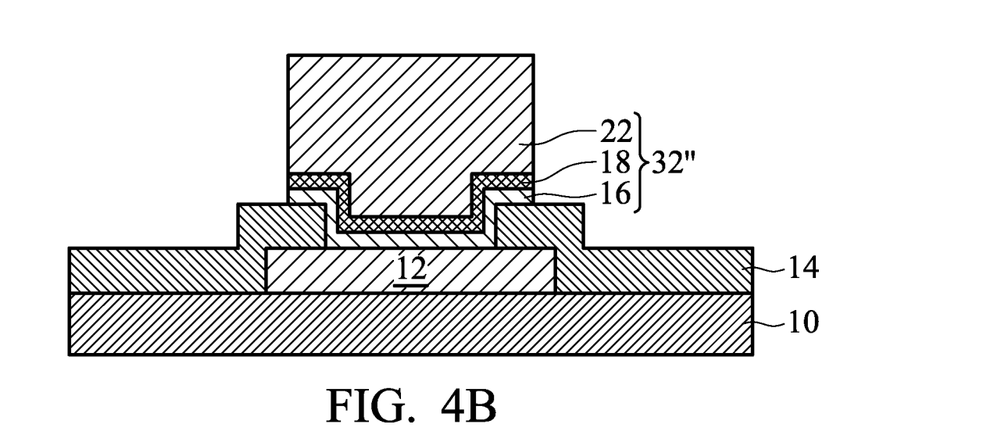
Figure 4C:
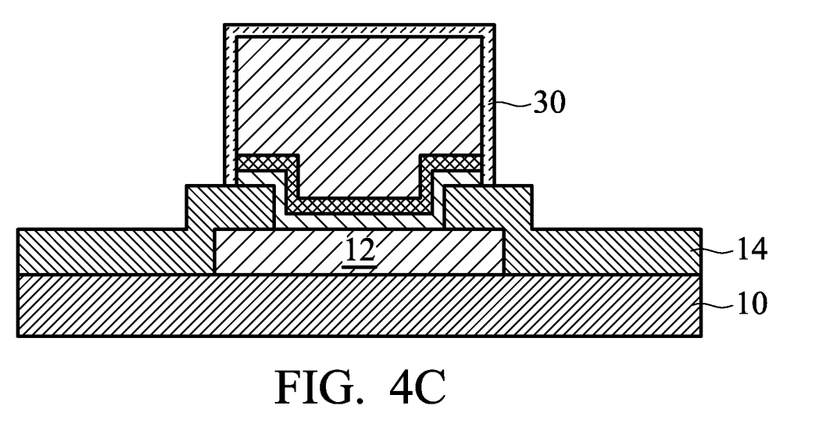
Figure 4D:
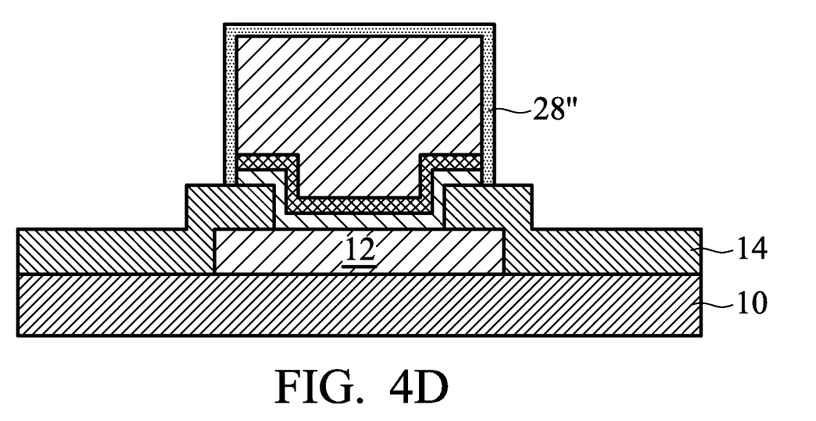

FIG. 4A to FIG. 4D are cross-sectional diagrams depicting an exemplary embodiment of a bump process without forming a cap layer and a solder layer on a Cu post, while explanation of the same or similar portions to the description in FIG. 1A to FIG. 1H and FIG. 2A to FIG. 2B will be omitted. Referring to FIG. 4A and FIG. 4B, after forming the thick Cu layer 22 within the opening 21 of the mask layer 20, the mask layer 20 is removed and then the uncovered portions of first protection layer 18 and the UBM layer 16 are etched, forming the metallization structure 32". Next, in FIG. 4C, the second protection layer 30 is formed on the sidewalls of the metallization structure 32". The second protection layer 30 may also be formed on the top surface of the protrusion, that is, on the top surface of the Cu post 22. In an embodiment, the second protection layer 30 is a tin-containing layer formed through a tin immersion process. As depicted in FIG. 4D, during thermal cycling, the IMC layer 28" may be observed on the sidewalls and/or top surfaces of the metallization structure 32". In one embodiment, the IMC layer 28" is a Cu—Sn IMC layer, which may consume some or the entire of the second protection layer 30.

Figure 5A:
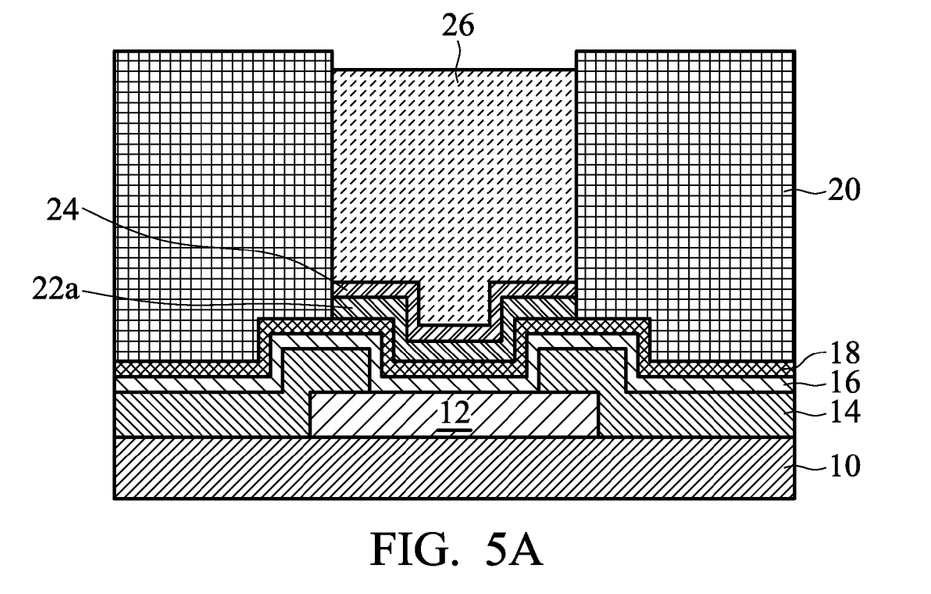
FIG. 5A to FIG. 5C are cross-sectional diagrams depicting an exemplary embodiment of a solder bump formation process.
Figure 5B:
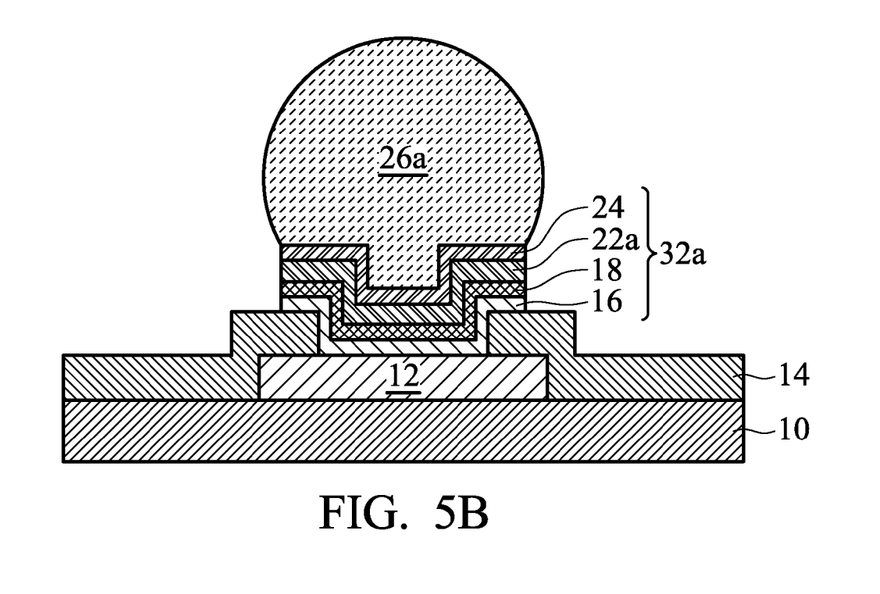
Figure 5C:
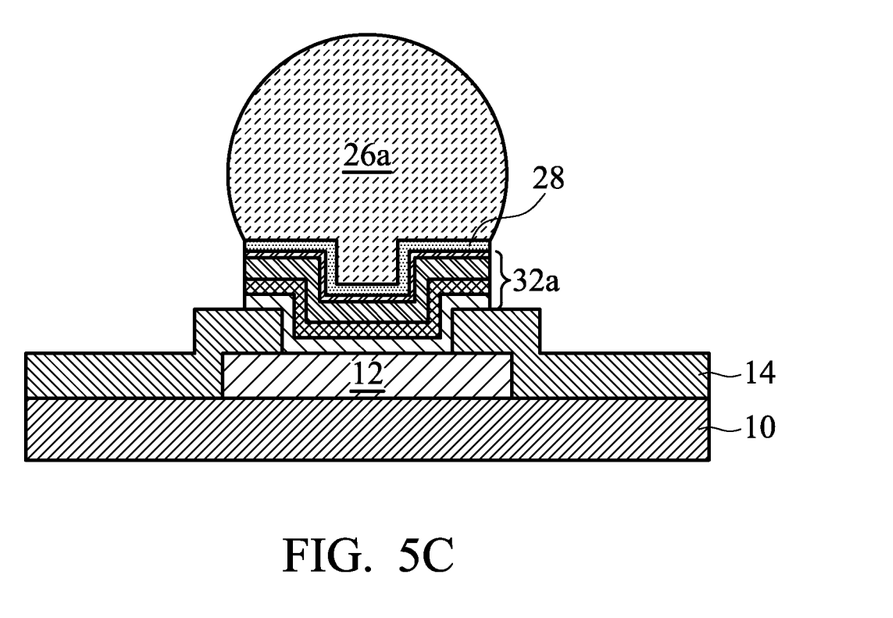

FIG. 5A to FIG. 5C are cross-sectional diagrams depicting an exemplary embodiment of a solder bump process, while explanation of the same or similar portions to the description in FIG. 1A to FIG. 1H will be omitted. Referring to FIG. 5A, a thin copper (Cu) layer 22a is deposited on the first protection layer 18 within the opening 21 of the mask layer 20 followed by the formation of the cap layer 24 and the solder layer 26. The thin Cu layer 22a has a thickness relatively thinner than the Cu post 22. The thin Cu layer 22a has a thickness less than 10 um. In an embodiment, the thin Cu layer 22a has a thickness about 1~10 μm, for example about 4~6 μm, although the thickness may be greater or smaller. The thin Cu layer formation methods may include sputtering, printing, electro plating, electroless plating, and commonly used chemical vapor deposition (CVD) methods. Next, as shown in FIG. 5B, after removing the mask layer 20, uncovered portions of the first protection layer 18 and the UBM layer 16 are removed to expose the passivation layer 14. The stacked layers 24, 22a, 18 and 16 are referred to as a metallization structure 32a with a height less then the metallization layer 32 or 32" depicted in FIG. 1 to FIG. 4. FIG. 5B also depicts the formation of a solder bump 26a on the cap layer 24 by performing a reflow process on the solder layer 26. During thermal cycling, the IMC layer 28 is formed between the solder bump 26a and the metallization structure 32a. If the cap layer 24 includes Ni, a $(Cu,Ni)_xSn_y$ IMC layer may be formed at the interface, which may have a controllable thickness and good adhesion. The cap layer 24 may be consumed during the IMC formation.

Figure 6A:
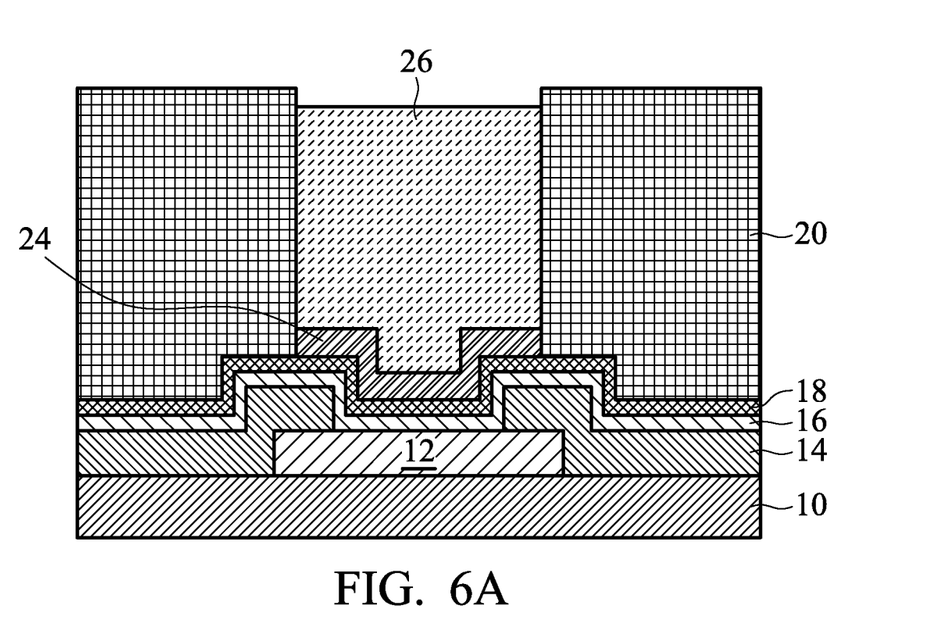
FIG. 6A to FIG. 6C are cross-sectional diagrams depicting an exemplary embodiment of a solder bump formation process.
Figure 6B:
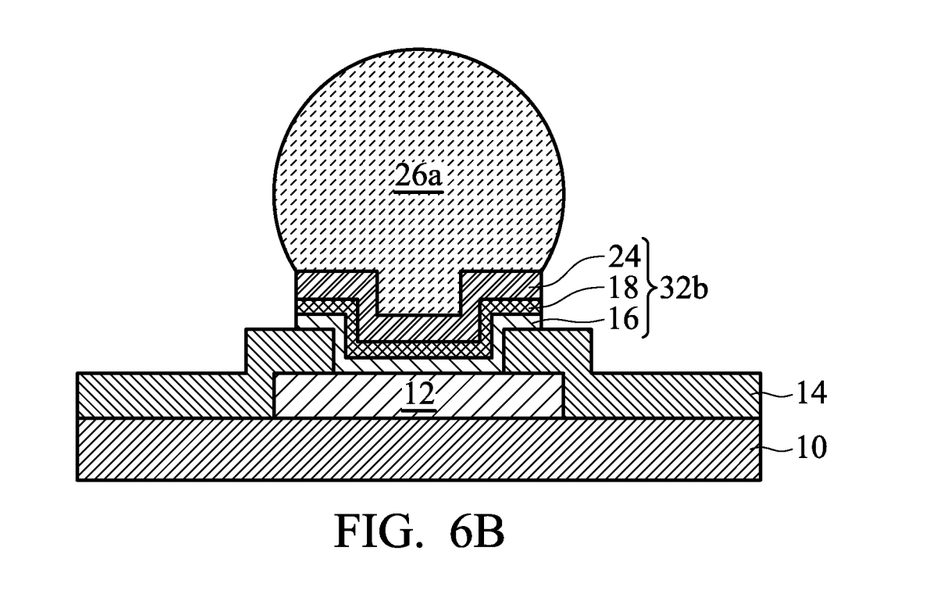
Figure 6C:
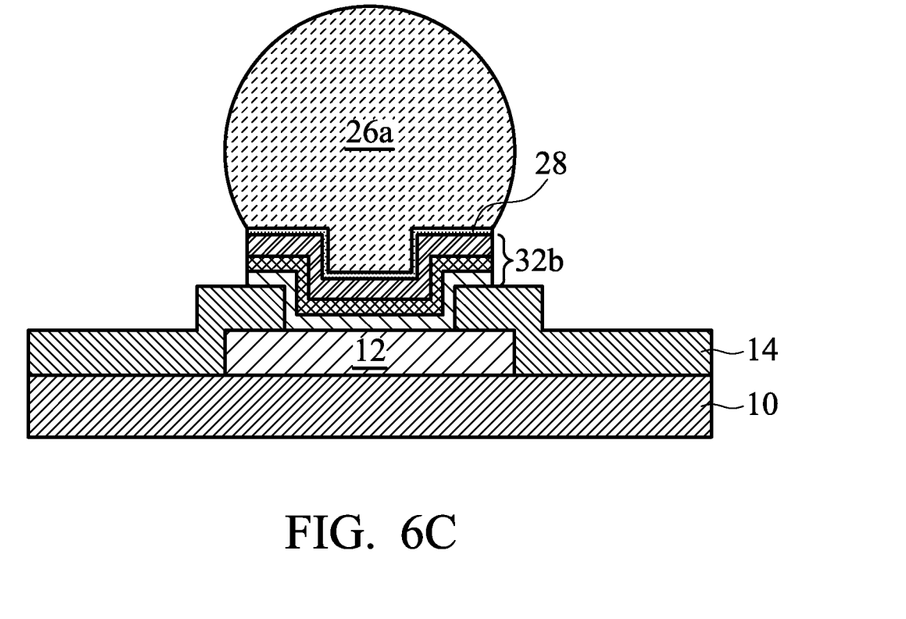

FIG. 6A to FIG. 6C are cross-sectional diagrams depicting an exemplary embodiment of a solder bump process, while explanation of the same or similar portions to the description in FIG. 5A to FIG. 5C will be omitted. Referring to FIG. 6A, the cap layer 24 is deposited on the first protection layer 18 within the opening 21 of the mask layer 20, and then the solder layer 26 is formed on the cap layer 24. After removing the mask layer 20, uncovered portions of the first protection layer 18 and the UBM layer 16 are etched to expose the passivation layer 14 as shown in FIG. 6B. The stacked layers 24, 18 and 16 are referred to as a metallization structure 32b with a height less then the metallization layer 32 or 32" depicted in FIG. 1 to FIG. 4. A solder reflow process is then performed on the solder layer 26 to form the solder bump 26a. During thermal cycling, the IMC layer 28 is formed between the solder bump 26a and the metallization structure 32b as shown in FIG. 6C. If the cap layer 24 includes Ni, an IMC layer including nickel, tin and others may be formed at the interface, which may be thin and have a flat surface. The cap layer 24 may be consumed during the IMC formation.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concepts as expressed herein.

What is claimed is:

1. An integrated circuit device, comprising:
   a semiconductor substrate;
   a bond pad region overlying the semiconductor substrate;
   a metallization structure overlying and electrically connected to the bond pad region, wherein the metallization structure comprises a first metal layer overlying the bond pad region, a first protection layer on the first metal layer, and a second metal layer on the first metal layer; and
   a lead-free second protection layer contacting the sidewalls of the entire metallization structure,
   wherein the first protection layer is a first copper-containing layer comprising Ge, Si, N, or combinations thereof.

2. The integrated circuit device of claim 1, wherein the first metal layer comprises at least one of a titanium layer, a copper layer or combinations thereof.

3. The integrated circuit device of claim 1, wherein the second metal layer comprises a second copper-containing layer.

4. The integrated circuit device of claim 3, wherein the second copper-containing layer has a thickness greater than 40 μm.

5. The integrated circuit device of claim 3, wherein the second copper-containing layer has a thickness less than 10 μm.

6. The integrated circuit device of claim 1, wherein the second metal layer comprises nickel.

7. The integrated circuit device of claim 1, wherein the third metal layer comprises nickel.

8. The integrated circuit device of claim 1, wherein sidewalls of the first metal layer are aligned with sidewalls of the second metal layer.

9. The integrated circuit device of claim 8, wherein the second protection layer comprises tin.

10. The integrated circuit device of claim 8, further comprising an intermetallic layer formed between the metallization structure and the second protection layer.

11. The integrated circuit device of claim 8, further comprising a solder bump overlying and electrically connected to the metallization structure.

12. The integrated circuit device of claim 11, further comprising an intermetallic layer formed between the metallization structure and the solder bump.

13. The integrated circuit device of claim 1, wherein the first protection layer is at least one of a $CuGe_yN_z$ layer, a $CuSi_xN_z$ layer, a $CuSi_xGe_yN_z$ layer or combinations thereof.

14. An integrated circuit device, comprising:
   a semiconductor substrate;
   a bond pad region overlying the semiconductor substrate;
   a passivation layer overlying the bond pad region and the semiconductor substrate, wherein the bond pad region comprises an uncovered portion not covered by the passivation layer;
   an under-bump metallurgy (UBM) layer formed on the uncovered portion of the bond pad region;
   a first protection layer on the UBM layer;
   a copper-containing post formed on the protection layer having sidewalls aligned with sidewalls of the UBM layer;
   a solder layer overlying the copper-containing post; and
   a second protection layer in direct contact with the sidewalls of the copper-containing post and overlying the solder layer,
   wherein the first protection layer is a copper-containing layer comprising Ge, Si, N, or combinations thereof.

15. The integrated circuit device of claim 14, further comprising a nickel-containing layer formed between the copper-containing post and the solder layer.

16. The integrated circuit device of claim 14, further comprising a tin-containing layer formed on sidewalls of the copper-containing post.

17. The integrated circuit device of claim 14, further comprising an intermetallic compound layer between the solder layer and the copper-containing post.

18. An integrated circuit device, comprising:
- a semiconductor substrate;
- a bond pad region overlying the semiconductor substrate;
- a passivation layer overlying the bond pad region and the semiconductor substrate, wherein the bond pad region comprises an uncovered portion not covered by the passivation layer;
- an under-bump metallurgy (UBM) layer formed on the uncovered portion of the bond pad region;
- a protection layer on the UBM layer;
- a nickel-containing layer formed overlying the protection layer and exposing sidewalls of the protection layer; and
- a solder layer on the nickel-containing layer;
- wherein the protection layer is a copper-containing layer comprising at least one of Ge, Si, N, or combinations thereof.

19. The integrated circuit device of claim 18, further comprising a copper-containing layer formed between the nickel-containing layer and the protection layer.

20. The integrated circuit device of claim 1, further comprising a solder layer overlying the metallization structure, the solder layer having a melting point substantially the same as the lead-free second protection layer.

\* \* \* \* \*